United States Patent [19]

Jinbo

[11] Patent Number: 5,267,207
[45] Date of Patent: Nov. 30, 1993

[54] ELECTRICALLY PROGRAMMABLE READ ONLY MEMORY DEVICE WITH RELIABLE SENSE AMPLIFIER CIRCUIT

[75] Inventor: Toshikatsu Jinbo, Tokyo, Japan

[73] Assignee: NEC Corporation, Tokyo, Japan

[21] Appl. No.: 772,431

[22] Filed: Oct. 7, 1991

[30] Foreign Application Priority Data

Oct. 17, 1990 [JP] Japan .................................. 2-278258

[51] Int. Cl.[5] .............................................. G11C 7/06
[52] U.S. Cl. .................................. 365/207; 365/196; 365/203
[58] Field of Search ............... 365/208, 210, 215, 207, 365/196, 203

[56] References Cited

U.S. PATENT DOCUMENTS

| | | | |
|---|---|---|---|
| 4,791,324 | 12/1988 | Hodapp | 365/207 |
| 4,879,682 | 11/1989 | Engles | 365/207 |
| 4,907,201 | 3/1990 | Minami et al. | 365/207 |

FOREIGN PATENT DOCUMENTS 58-125282  7/1983  Japan .

*Primary Examiner*—Eugene R. LaRoche
*Assistant Examiner*—Viet Q. Nguyen
*Attorney, Agent, or Firm*—Laff, Whitesel, Conte & Saret

[57] ABSTRACT

An electrically programmable read only memory device memorizes data bits in memory cells each implemented by a pair of floating gate type field effect transistors, and first and second current mirror circuits supplies currents to a pair of digit lines coupled to the pair of floating gate type field effect transistors for producing a difference in voltage level indicative of the read-out data bit which is quickly converted into a voltage level with a third current mirror circuit, wherein the ratio of conductances of first and second current paths of the third current mirror circuit is controlled by a ratio controlling circuit depending upon an output data signal so that an output inverting circuit coupled with the third current mirror circuit never transiently shifts the voltage level of the output data signal upon changing the memory cell to be accessed.

9 Claims, 10 Drawing Sheets

ELECTRICALLY PROGRAMMABLE READ ONLY MEMORY DEVICE WITH RELIABLE SENSE AMPLIFIER CIRCUIT

FIELD OF THE INVENTION

This invention relates to an electrically programmable read only memory device and, more particularly, to a sense amplifier circuit free from an error in a read-out operation.

DESCRIPTION OF THE RELATED ART

A floating gate type field effect transistor is used for a non-volatile memory cell array, and a typical example of the floating gate type field effect transistor is illustrated in FIG. 1. The floating gate type field effect transistor is fabricated on a p-type silicon substrate 1, and source and drain regions 2a and 2b are formed in the major surface portion of the silicon substrate 1 at spacing. A first thin gate oxide film 3 is grown on that area between the source and drain regions 2a and 2b, and a floating gate electrode 4 is provided on the first thin gate oxide film 3. A second thin gate oxide film 5 covers the floating gate electrode 4, and a control gate electrode 6 is patterned in an overlapped manner with the floating gate electrode 4. An inter-level insulating film structure 7 covers the entire surface, and appropriate peripheral circuits (not shown) control the control gate electrode 6 as well as the source and drain regions 2a and 2b. The floating gate type field effect transistor thus constructed is expressed as shown in FIG. 2, and the symbol of the floating gate type field effect transistor is used in the attached drawings.

The threshold level of the floating gate type field effect transistor is variable with hot electrons injected into the floating gate electrode 6. Namely, if the drain region 2b is strongly biased to a positive voltage level with respect to the silicon substrate 1, hot electrons are produced at the p-n junction therebetween, and the positively biased control gate electrode 6 attract the hot electron toward the floating gate electrode 4. Then, the hot electrons are accumulated into the floating gate electrode 4, and the drain current traces plot A1 by changing the voltage level at the control gate electrode 6. However, when the electrons accumulated in the floating gate electrode 4 are evacuated from the floating gate electrode 4, the drain current traces plots A2 by changing the voltage level at the control gate electrode 6. The relatively high threshold level and the relatively low threshold level correspond to a write-in state and an erased state, respectively, and the floating gate type filed effect transistor changes the channel conductance depending upon the state thereof. If a read-out voltage level at a mid point MP between the two threshold levels is applied to the control gate electrode 6, the floating gate type field effect transistor in the erased state turns on to provide a conductive channel between the source and drain regions 2a and 2b. However no conductive channel takes place in the floating gate type field effect transistor in the write-in state. The read-out voltage level is usually about 2 volts, and the drain region 2b and the control gate electrode 6 are biased to about 12.5 volts for producing the hot electrons.

Using the relatively high and low threshold levels as two logic levels, the floating gate type field effect transistor is available for a non-volatile memory cell array. A non-volatile memory cell assigned to a single data bit may be implemented by a single floating gate type field effect transistor. However, a pair of floating gate type field effect transistors form in combination a single non-volatile memory cell for speed-up.

FIG. 4 shows a typical example of the electrically programmable read only memory device with non-volatile memory cells each implemented by a pair of floating gate type field effect transistors. The prior art electrically programmable read only memory device largely comprises a memory cell array 11 associated with word lines WL1, WL2 and WLm as well as with digit lines D1a to Dna and D1b to Dnb, a row address decoding unit 12 coupled with the word lines WL1 to WLm, a column selecting unit 13 coupled with the digit lines D1a to Dna and D1b to Dnb, a column address decoding unit 14 associated with the column selecting unit 13, and a sense amplifier unit 15.

The memory cell array 11 is broken down into two sections. The first section is implemented by floating gate type field effect transistors MA11 to MAmn arranged in rows and columns, and the second section is also implemented by floating gate type field effect transistors MB11 to MBmn arranged in rows and columns. The floating gate type field effect transistors MA11 to MAmn in the first section are respectively paired with the floating gate type field effect transistors MB11 to MBmn so that a plurality of transistor pairs are formed in the non-volatile memory cell array 11. The plurality of transistor pairs respectively form the non-volatile memory cells, and a single data bit is memorized in one of the memory cells. In order to memorize a data bit, one of the floating gate type field effect transistors of a memory cell enters the write-in state with the relatively high threshold level, leaving the other floating gate type field effect transistor in the erased state with the relatively low threshold level. The rows of the first section respectively are associated with the rows of the second section, and the word lines WL1 to WLm are shared between the respective associated rows of the first and second sections. The digit lines D1a to Dna are respectively associated with the columns of the floating gate type field effect transistors MA11 to MAmn of the first section, and the digit lines D1b to Dnb are also associated with the columns of the columns of the floating gate type field effect transistors MB11 to MBmn, respectively. However, a source line Vss is shared between all of the floating gate type field effect transistors MA11 to MAmn and MB11 to MBmn. The digit lines D1a to Dna are respectively paired with the digit lines D1b to Dnb so as to form digit line pairs, and the digit line pairs are respectively associated with the transistor pairs or the non-volatile memory cells, respectively. In other words, a data bit read out from one of the non-volatile memory cells is propagated by the associated digit line pair.

The column selecting unit 13 is also broken down into first and second sections, and the first and second sections of the column selecting unit 13 are associated with the digit lines D1a to Dna and D1b to Dnb, respectively. The first section of the column selecting unit 13 is implemented by n-channel enhancement type transfer transistors TG1a to TGna, and other n-channel enhancement type transfer transistors TG1b to TGnb form the second section. The n-channel enhancement type transfer transistors TG1a to TGna are coupled between the digit lines D1a to Dna and a first input node 15aa of the sense amplifier unit 15, and the n-channel enhancement type transfer transistors TG1b to TGnb are coupled between a second input node 15ab of the sense amplifier unit 15 and the digit lines D1b to Dnb. The n-channel enhancement type transfer transistors TG1a to TGna are respectively associated with the n-channel enhancement type transfer transistors TG1b to TGnb, and decoded signal lines DS1 to DSn are shared between the respective associated n-channel enhancement type transfer transistors TG1a to TGna and TG1b to TGnb. For this reason, when the column address decoding unit 14 drives one of the decoded signal lines DS1 to DSn, two transfer transistors concurrently turn on so as to couple the associated digit line pair with the first and second input nodes 15aa and 15ab, and a data bit on the digit line pair is relayed to the sense amplifier unit 15.

The sense amplifier unit 15 further comprises two inverting circuits 15ba and 15bb coupled at the input nodes thereof with the first and second input nodes 15aa and 15ab, two n-channel enhancement type gate transistors 15ca and 15cb respectively gated by the inverting circuits 15ba and 15bb, first and second current mirror circuits 15da and 15db coupled between a power voltage source Vcc and the n-channel enhancement gate transistors 15ca and 15cb, a third current mirror circuit 15e coupled between the first and second current mirror circuits 15da and 15db and the source voltage line Vss, and an inverting circuit coupled between the third current mirror circuit 15e and an output data terminal OUT. The first current mirror circuit 15da is implemented by a pair of p-channel enhancement type field effect transistors Qp1 and Qp2, and the gate electrodes of the pair of p-channel enhancement type field effect transistors Qp1 and Qp2 are coupled with the drain node of the p-channel enhancement type field effect transistor Qp1. The amount of current passing through each p-channel enhancement type field effect transistor Qp1 or Qp2 is varied with the voltage level at the drain node, and the currents are supplied to the n-channel enhancement type gate transistor 15ca and the third current mirror circuit 15e, respectively. Similarly, the second current mirror circuit 15db is implemented by two p-channel enhancement type field effect transistors Qp3 and Qp4, and currents passing through these transistors Qp3 and Qp4 are varied with the voltage level at the drain node of the p-channel enhancement type field effect transistor Qp4. For this reason, the currents are supplied to the n-channel enhancement type gate transistor 15cb and the third current mirror circuit 15e. The third current mirror circuit 15e is implemented by two n-channel enhancement type field effect transistors Qn5 and Qn6 coupled between the first and second current mirror circuits 15da and 15db and the source voltage line Vss, and the n-channel enhancement type field effect transistors Qn5 and Qn6 are gated by the drain node of the n-channel enhancement type field effect transistor Qn5. Therefore, currents passing through the transistors Qn5 and Qn6 are varied with the voltage level at the drain node of the transistor Qn5, i.e., the amount of current passing through the p-channel enhancement type field effect transistor Qp2, and the voltage level at the drain node N1 of the n-channel enhancement type field effect transistor Qn6 is relayed to the inverting circuit 15f. The voltage level at the drain node of the transistor Qn6 is indicative of a data bit read out from one of the non-volatile memory cells, and the inverting circuit 15f produces an output data signal Dout. In this instance, all of the p-channel enhancement type field effect transistors Qp1 to Qp4 have the same transconductance, and the transconductance of the n-channel enhancement type field effect transistor Qn5 is as large as that of the n-channel enhancement type field effect transistor Qn6.

Description is hereinbelow made on circuit behaviors of the electrically programmable read only memory device on the assumption that row address bits and column address bits are indicative of the memory cell formed by the transistor pair MA11 and MB11. The row address decoding unit 12 decodes the row address bits, and the word line WL1 goes up. With the column address bits, the column address decoding unit 14 causes the decoded signal line DS1 to go up to the active high voltage level, and the n-channel enhancement type transfer transistors TG1a and TG1b concurrently turn on to couple the first and second input nodes 15aa and 15ab with the digit lines D1a and D1b, respectively.

If the accessed data bit is represented by the floating gate type field effect transistor MA11 in the write-in state and the floating gate type field effect transistor MB11 in the erased state, the digit line D1a and, accordingly, the first input node 15aa are isolated from the source voltage line Vss, and the voltage level at the first input node 15aa is elevated toward the power voltage level Vcc. Then, the inverting circuit 15ba causes the n-channel enhancement gate transistor 15ca to turn off, and the first current mirror circuit 15da minimizes the current supplied to the third current mirror circuit 15e. On the other hand, the floating gate type field effect transistor MB11 in the erased state conducts the digit line D1b with the source voltage line Vss, and the voltage level at the second input node 15ab is decayed. The inverting circuit 15bb allows the n-channel enhancement type gate transistor 15cb to turn on, and the second current mirror circuit 15db increases the amount of current supplied to the third current mirror circuit 15e. Since the first current mirror circuit 15da decreases the current supplied to the third current mirror circuit 15e, the n-channel enhancement type field effect transistors Qn5 and Qn6 turn off, and the large amount current supplied from the second current mirror circuit 15db rapidly elevates the voltage level at the drain node N1. The inverting circuit 15f produces the output data signal Dout indicative of the accessed data bit, and the first to third current mirror circuits 15da, 15db and 15e speed up the read-out operation.

If the accessed data bit is represented by the floating gate type field effect transistor MA11 in the erased state and the floating gate type field effect transistor MB11 in the write-in state, current flows from the digit line D1a through the floating gate type field effect transistor MA11 to the source voltage line Vss, and the voltage level at the first input node 15aa is decayed toward the source voltage level Vss. The inverting circuit 15ba causes the n-channel enhancement type gate transistor 15ca to turn on, and the first current mirror circuit 15da maximizes the current supplied to the third current mirror circuit 15e. However, the floating gate type field effect transistor MB11 keeps off, and the voltage level at the second input node 15ab remains high. For this reason, the inverting circuit 15bb causes the n-channel enhancement type gate transistor 15cb to turn off, and the second current mirror circuit 15db minimizes the current supplied to the third current mirror circuit 15e. The maximized current supplied from the first current mirror circuit 15da allows the n-channel enhancement type field effect transistors Qn5 and Qn6 to fully turn on, and the voltage level at the drain node N1 is rapidly decayed. Then, the inverting circuit 15f alters the voltage level of the output data signal Dout.

Thus, the prior art electrically programmable read only memory device allows an external device to access a data bit memorized therein at high speed. However, the prior art electrically programmable read only memory device tends to fall into an error in the read-out operation. In detail, assuming now that an external device sequentially accesses the memory cell with the floating gate type field effect transistor in the erased state and the memory cell with the floating gate type field effect transistor MA12 in the write-in state, the column address decoding unit 14 elevates the decoded signal line DS2, recovering the decoded signal line DS1 at time t1 of FIG. 5. While the decoded signal line DS1 is altering with the decoded signal line DS2, the first and second current mirror circuits 15da and 15db supply currents to the digit lines D2a and D2b, and the currents are approximately equal to each other. Then, the digit lines D2a and D2b are charged up toward the threshold levels of the inverting circuits 15ba and 15bb, and the current driving capability of the p-channel enhancement transistor Qp3 is balanced with the current driving capability of the n-channel enhancement type field effect transistor Qn6 at point P1 of FIG. 6. In FIG. 6, plots A3 and A4 stand for the current passing through the p-channel enhancement type field effect transistor Qp3 and the n-channel enhancement type field effect transistor Qn6, respectively. If the current driving capability of the p-channel enhancement type field effect transistor Qp3 is symmetry with that of the n-channel enhancement type field effect transistor Qn6, the point P1 is about Vcc/2. The threshold level of the inverting circuit 15f is not strictly adjustable to a target level, and some products have threshold levels lower than the point P1 due to fluctuation of process parameters. If the inverting circuit 15f is lower in threshold level than the point P1, the inverting circuit 15f transiently changes the output data signal Dout from the high level to the low level, and the low level is kept low over a certain time period between time t1 to time t2. The output data signal Dout in the certain time period is not indicative of the data bit read out from the previously accessed memory cell, and the prior art electrically programmable read only memory device falls into an error in the read-out operation.

SUMMARY OF THE INVENTION

It is therefore an important object of the present invention to provide an electrically programmable read only memory device which hardly falls into an error in a read-out operation.

To accomplish these objects, the present invention proposes to space apart the voltage level at a common node between second and third current mirror circuits from the threshold level of an output inverting circuit.

In accordance with the present invention, there is provided a non-volatile semiconductor memory device fabricated on a single semiconductor chip, comprising: a) a memory cell array having a plurality of non-volatile memory elements arranged in rows and columns, the columns of the non-volatile memory elements being divided into two sections so as to form first and second memory sections, the non-volatile memory elements of the first memory section being respectively paired with the non-volatile memory elements of the second memory section so as to form a plurality of memory cells for storing data bits, respectively; b) a plurality of word lines respectively coupled with the rows of the non-volatile memory elements, and selectively activating the memory cells; c) first digit lines respectively coupled with the columns of the non-volatile memory elements of the first memory section; d) second digit lines respectively coupled with the columns of the non-volatile memory elements of the second memory section, and respectively paired with the first digit lines so as to form digit line pairs for propagating data bits read out from activated memory cells, each of the data bits read out from the activated memory cells being in the form of a difference in voltage level; e) a column selecting unit coupled with the digit line pairs for interconnecting one of the digit line pairs and first and second output nodes thereof; and f) a sense amplifier unit comprising f-1) a first current mirror circuit having a first input node for controlling the amount of first current, f-2) a first gate means responsive to the voltage level at the first output node, and relaying the voltage level at the first output node to the first input node, f-3) a second current mirror circuit having a second input node for controlling the amount of second current, f-4) a second gate means responsive to the voltage level at the second output node, and relaying the voltage level at the second output node to the second input node, f-5) a third current mirror circuit having a first current path assigned to the first current, a second current path assigned to the second current path, a third input node supplied with the first current for concurrently controlling the conductances of the first and second current paths, and a fourth input node supplied with the second current path, f-6) an output inverting circuit having an input node coupled with the fourth input node and producing an output data signal, and f-7) a ratio controlling circuit responsive to the output data signal and operative to change a ratio of the conductance of the second current path to the conductance of the first current path.

BRIEF DESCRIPTION OF THE DRAWINGS

The features and advantages of the electrically programmable read only memory device according to the present invention will be more clearly understood from the following description taken in conjunction with the accompanying drawings in which.

DESCRIPTION OF THE PREFERRED EMBODIMENTS

First Embodiment

Figure 1:
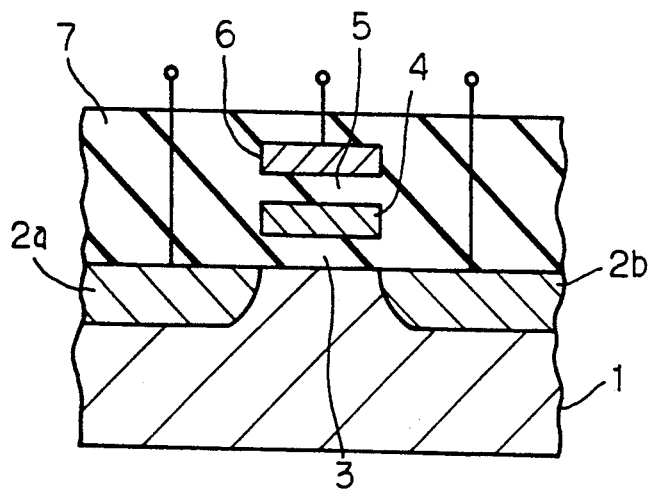
FIG. 1 is a cross sectional view showing the structure of the floating gate type field effect transistor used for a non-volatile semiconductor memory cell.
Figure 2:
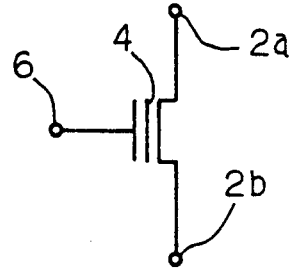
FIG. 2 is a view showing the symbol of the floating gate type field effect transistor shown in FIG. 1.
Figure 3:
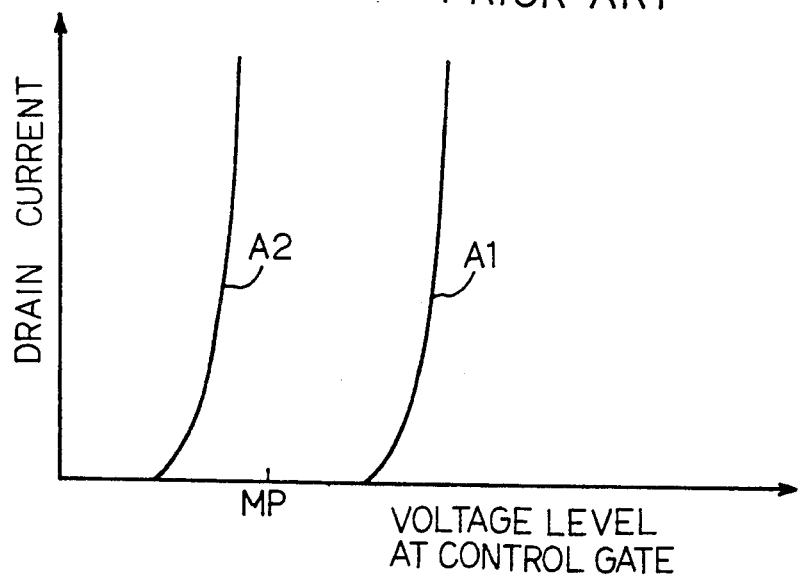
FIG. 3 is a graph showing drain current in terms of voltage level at the control gate electrode of the floating gate type field effect transistor.
Figure 4:
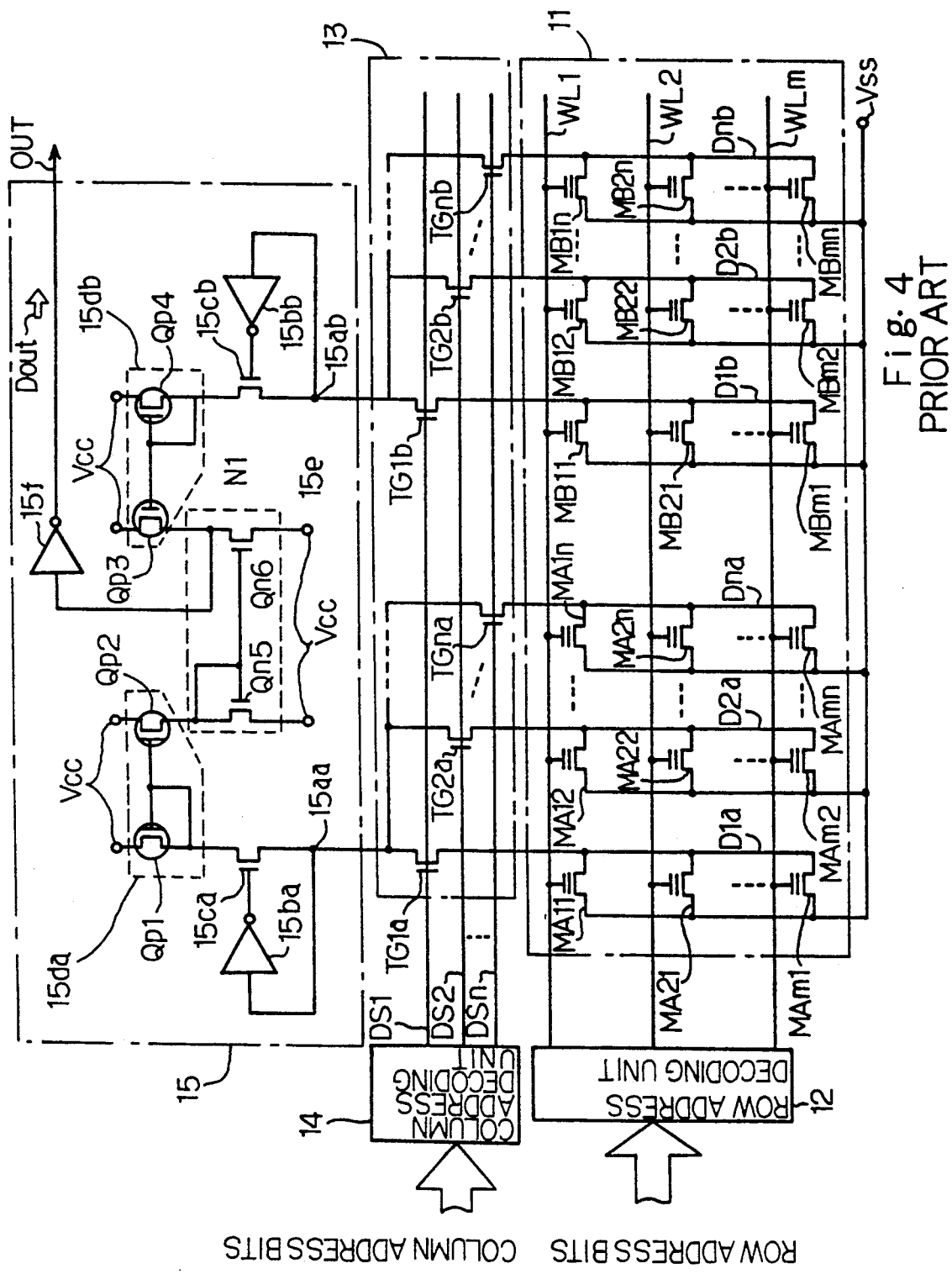
FIG. 4 is a circuit diagram showing the arrangement of the prior art electrically programmable read only memory device.
Figure 5:
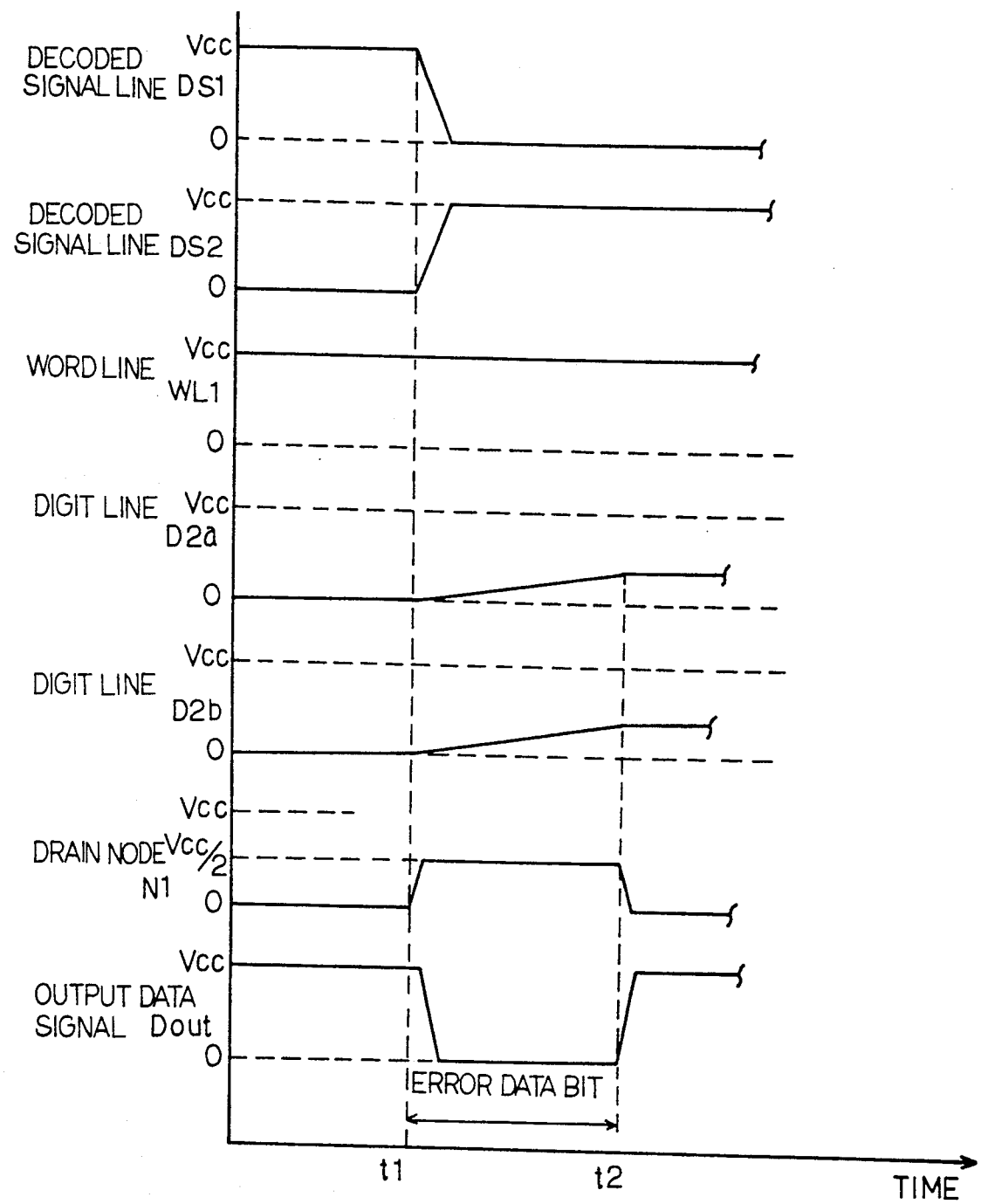
FIG. 5 is a diagram showing the waveforms on component lines and nodes incorporated in the prior art electrically programmable read only memory device.
Figure 6:
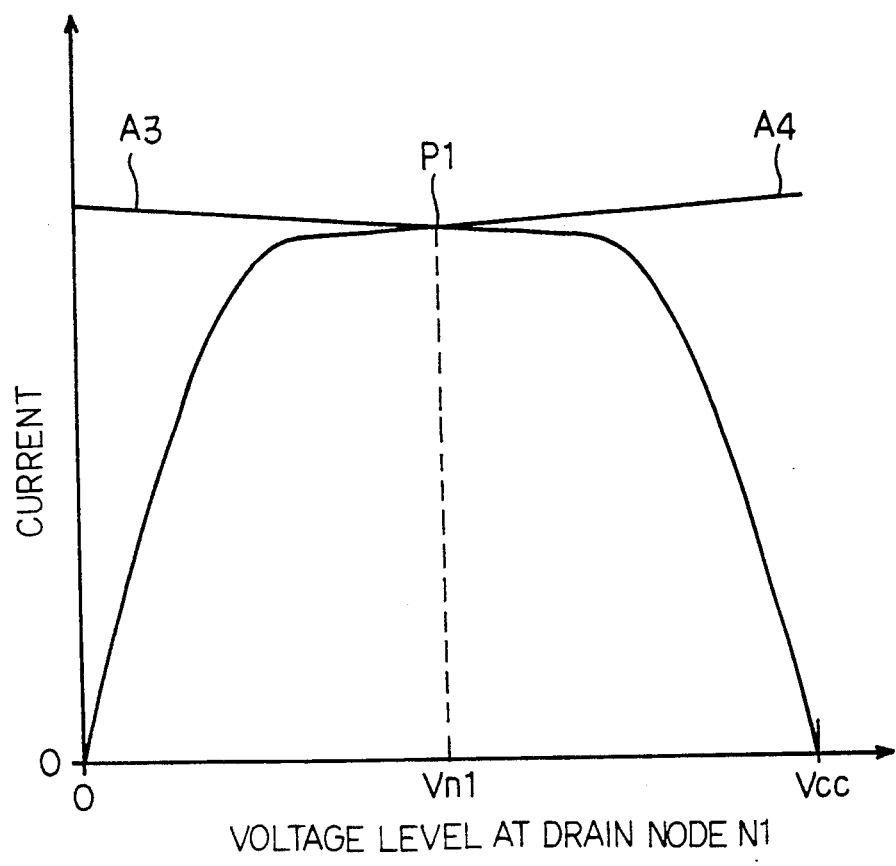
FIG. 6 is a graph showing the voltage level at the drain node N1 in terms of currents passing through the second and third current mirror circuits of the prior art electrically programmable read only memory device.
Figure 7:
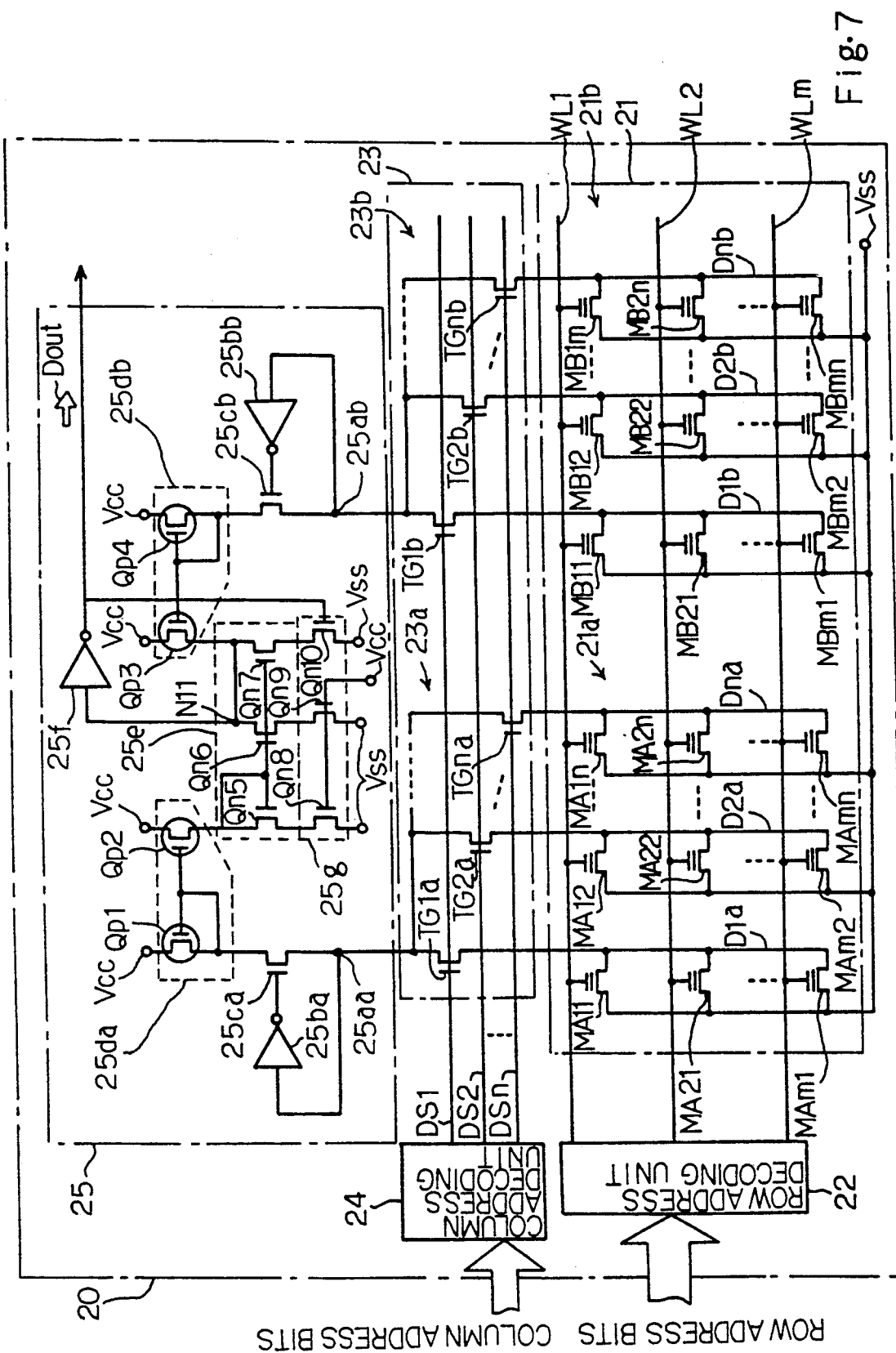
FIG. 7 is a circuit diagram showing the arrangement of an electrically programmable read only memory device according to the present invention.

Referring to FIG. 7 of the drawings, an electrically programmable read only memory device embodying the present invention is fabricated on a single semiconductor chip 20, and largely comprises a memory cell array 21 associated with word lines WL1, WL2 and WLm as well as with digit lines D1a to Dna and D1b to Dnb, a row address decoding unit 22 coupled with the word lines WL1 to WLm, a column selecting unit 23 coupled with the digit lines D1a to Dna and D1b to Dnb, a column address decoding unit 24 associated with the column selecting unit 23, and a sense amplifier unit 25 coupled with the column selecting unit 23.

The memory cell array 21 is broken down into two sections 21a and 21bs, and the first section 21a is implemented by floating gate type field effect transistors MA11 to MAmn arranged in rows and columns, and the second section 21b is also implemented by floating gate type field effect transistors MB11 to MBmn arranged in rows and columns. The floating gate type field effect transistors MA11 to MAmn in the first section 21a are respectively paired with the floating gate type field effect transistors MB11 to MBmn so that a plurality of transistor pairs are formed in the non-volatile memory cell array 21. The plurality of transistor pairs respectively form the non-volatile memory cells, and a single data bit is memorized in one of the memory cells. In order to memorize a data bit in one of the memory cells, one of the floating gate type field effect transistors of the memory cell enters a write-in state with the relatively high threshold level, leaving the other floating gate type field effect transistor in an erased state with the relatively low threshold level. The write-in state is established by injecting hot electrons into the floating gate electrode under strongly reversed biased condition of the p-n junction between the drain region and the semiconductor substrate 20. On the other hand, if the electrons are evacuated from the floating gate electrode, the floating gate type field effect transistor enters the erased state. Exposure to ultra-violet radiation allows the electrons to be evacuated from the floating gate electrode. The rows of the first section 21a are respectively associated with the rows of the second section 21b, and the word lines WL1 to WLm are shared between the respective associated rows of the first and second sections 21a and 21b. The digit lines D1a to Dna are respectively associated with the columns of the floating gate type field effect transistors MA11 to MAmn of the first section 21a, and the digit lines D1b to Dnb are also associated with the columns of the columns of the floating gate type field effect transistors MB11 to MBmn, respectively. However, a source line Vss is shared between all of the floating gate type field effect transistors MA11 to MAmn and MB11 to MBmn. The digit lines D1a to Dna are respectively paired with the digit lines D1b to Dnb so as to form digit line pairs, and the digit line pairs are respectively associated with the transistor pairs or the non-volatile memory cells, respectively. In other words, a data bit read out from one of the non-volatile memory cells is propagated by the associated digit line pair.

The column selecting unit 23 is also broken down into first and second sections 23a and 23b, and the first and second sections 23a an 23b of the column selecting unit 23 are associated with the digit lines D1a to Dna and D1b to Dnb, respectively. The first section 23a of the column selecting unit 23 is implemented by n-channel enhancement type transfer transistors TG1a to TGna, and other n-channel enhancement type transfer transistors TG1b to TGnb form in combination the second section 23b. The n-channel enhancement type transfer transistors TG1a to TGna are coupled between the digit lines D1a to Dna and a first input node 25aa of the sense amplifier unit 25, and the n-channel enhancement type transfer transistors TG1b to TGnb are coupled between a second input node 25ab of the sense amplifier unit 25 and the digit lines D1b to Dnb. The n-channel enhancement type transfer transistors TG1a to TGna are respectively associated with the n-channel enhancement type transfer transistors TG1b to TGnb, and decoded signal lines DS1 to DSn are shared between the respective associated n-channel enhancement type transfer transistors TG1a to TGna and TG1b to TGnb. For this reason, when the column address decoding unit 14 drives one of the decoded signal lines DS1 to DSn, two transfer transistors coupled therewith concurrently turn on so as to couple the associated digit line pair with the first and second input nodes 25aa and 25ab, and a data bit on the digit line pair is relayed to the sense amplifier unit 25.

The sense amplifier unit 25 further comprises two inverting circuits 25ba and 25bb coupled at the input nodes thereof with the first and second input nodes 25aa and 25ab, two n-channel enhancement type gate transistors 25ca and 25cb respectively gated by the inverting circuits 25ba and 25bb, first and second current mirror circuits 25da and 25db coupled between a power voltage source Vcc and the n-channel enhancement gate transistors 25ca and 25cb, a third current mirror circuit 25e coupled with the first and second current mirror circuits 25da and 25db, an output inverting circuit coupled with an output node N11 of the third current mirror circuit 25e and producing an output data signal Dout, and a ratio controlling circuit 25g coupled between the third current mirror circuit 25e and the source voltage line Vss and responsive to the output data signal Dout. The inverting circuit 25ba and the n-channel enhancement type gate transistor 25ca form in combination a first gate means, and the inverting circuit 25bb and the n-channel enhancement type gate transistor 25cb as a whole constitute a second gate means.

The first current mirror circuit 25*da* is implemented by a pair of p-channel enhancement type field effect transistors Qp1 and Qp2, and the gate electrodes of the pair of p-channel enhancement type field effect transistors Qp1 and Qp2 are coupled with the drain node of the p-channel enhancement type field effect transistor Qp1. The amount of first current passing through each p-channel enhancement type field effect transistor Qp1 or Qp2 is varied with the voltage level at the drain node, and the first currents are supplied to the n-channel enhancement type gate transistor 25*ca* and the third current mirror circuit 25*e*, respectively. Similarly, the second current mirror circuit 25*db* is implemented by two p-channel enhancement type field effect transistors Qp3 and Qp4, and a second currents passing through each transistor Qp3 or Qp4 is varied with the voltage level at the drain node of the p-channel enhancement type field effect transistor Qp4. The second currents are supplied to the n-channel enhancement type gate transistor 25*cb* and the third current mirror circuit 25*e*. The third current mirror circuit 25*e* is implemented by three n-channel enhancement type field effect transistors Qn5, Qn6 and Qn7 coupled between the first and second current mirror circuits 15*da* and 15*db* and the ratio controlling circuit 25*g*, and the n-channel enhancement type field effect transistors Qn5, Q6 and Qn7 are gated by the drain node of the n-channel enhancement type field effect transistor Qn5. The n-channel enhancement type field effect transistor Qn5 provides a first current path assigned to the first current, and the n-channel enhancement type field effect transistors Qn6 and Qn7 provide a second current path for the second current. The first and second currents passing through the first and second current paths ar concurrently varied with the voltage level at the drain node of the transistor Qn5, i.e., the amount of the first current, and the voltage level at the drain node N1 of the n-channel enhancement type field effect transistor Qn6 is relayed to the inverting circuit 15*f*. The ratio controlling circuit 25*g* is implemented by three n-channel enhancement type field effect transistors Qn8, Qn9 and Qn10 coupled between the n-channel enhancement type field effect transistors Qn8 to Qn10 and the source voltage line Vss. The gate electrodes of the n-channel enhancement type field effect transistors Qn8 and Qn9 are coupled with the source of power voltage level Vcc, however, the output data signal Dout is supplied to the gate electrode of the n-channel enhancement type field effect transistor Qn10. Since the n-channel enhancement type field effect transistors Qn8 and Qn9 are turned on at all times, the conductance of the second current path is variable by shifting the n-channel enhancement type field effect transistor Qn10 between on and off states, and, for this reason, the output data signal Dout controls the conductance of the second current path.

Figure 8:
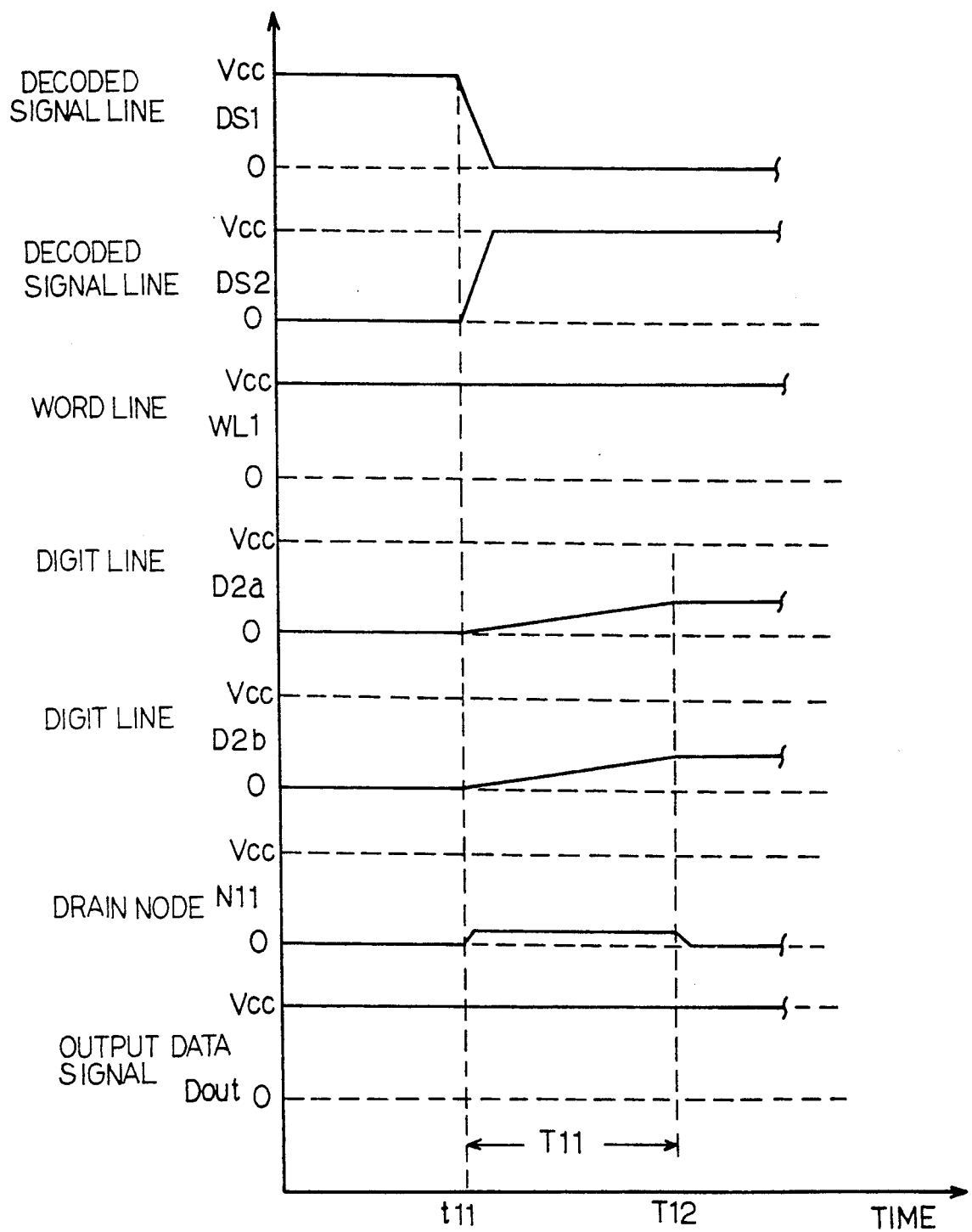
FIG. 8 is a diagram showing the waveforms on component lines and the input node of the electrically programmable read only memory device.

Circuit behavior of the electrically programmable read only memory device embodying the first embodiment is hereinbelow described with reference to FIG. 8. For easy description, the p-channel enhancement type field effect transistors Qp1, Qp2, Qp3 and Qp4 are assumed to be equal in transconductance, the n-channel enhancement type field effect transistors Qn5 to Qn7 are assumed to be equal in transconductance, and the n-channel enhancement type field effect transistors Qn8 to Qn10 are assumed to be equal in transconductance. We further assume that the floating gate type field effect transistors MA11 and MB12 remain erased and that the floating gate type field effect transistors MA12 and MB11 are in the write-in state.

Figure 9:
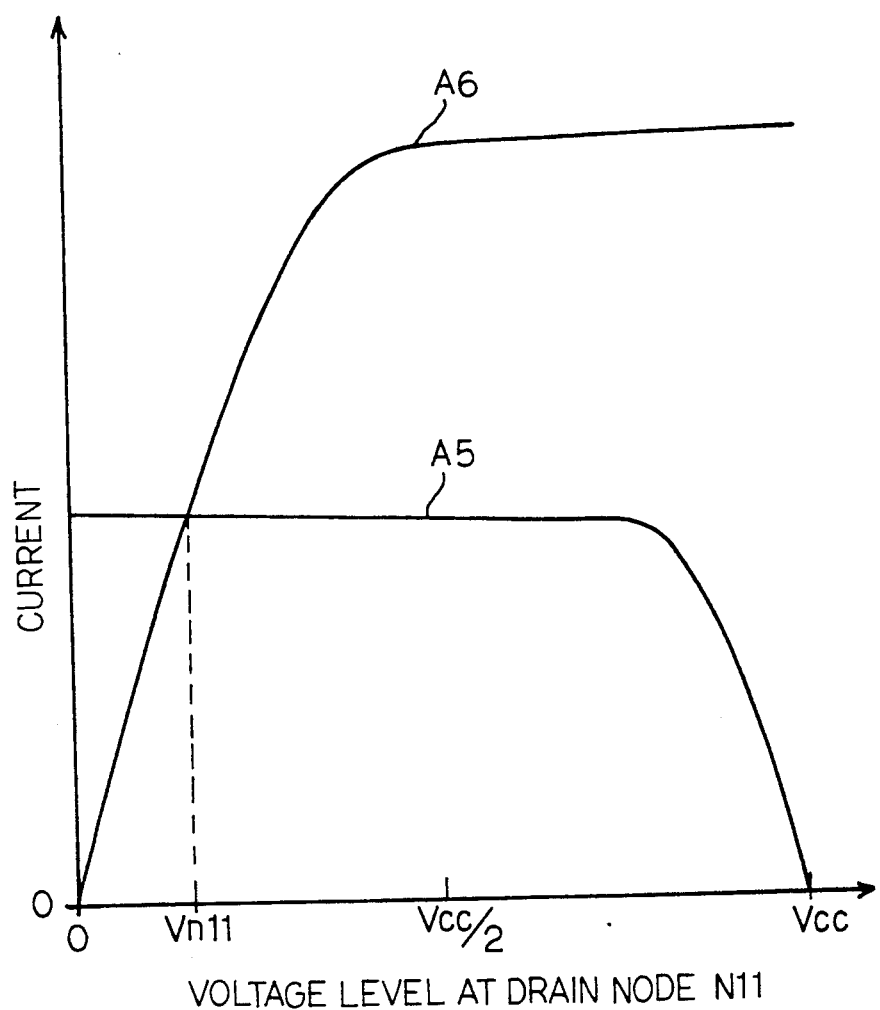
FIG. 9 is a graph showing the voltage level at an input node of an output inverting circuit in terms of currents passing through second and third current mirror circuits incorporated in the electrically programmable read only memory device shown in FIG. 7.

While the memory cell implemented by the floating gate type field effect transistors MA11 and MB11 are selected by the word line WL1 and the decoded signal line DS1, the output inverting circuit 25*f* produces the output data signal Dout to the power voltage level Vcc. If the column address decoding circuit 24 elevates the decoded signal line DS2 and recovers the decoded signal line DS1 at time 11, the column selecting unit 23 couples the digit lines D2*a* and D2*b* with the input nodes 15*aa* and 15*bb*, respectively, and the first and second current mirror circuits 25*da* and 25*db* charge up the digit lines D2*a* and D2*b* toward the threshold level of the inverting circuits 25*ba* and 25*bb*. The first and second current mirror circuits 25*da* and 25*db* continue to respectively supply the first and second currents to the digit lines D2*a* and D2*b* at the same speed over time period T11 from time t11 to t12. Since the output data signal Dout is elevated to the power voltage level Vcc, the n-channel enhancement type field effect transistor Qn10 is turned on, and the second current path is increased in conductance. In this situation, the second current passing through the p-channel enhancement type field effect transistor Qp3 traces plots A5 of FIG. 9, and the second current path provided by the n-channel enhancement type field effect transistors Qn9 and 10 allows current to flow therethrough along plots A6. Therefore, the drain node N11 is regulated at Vn11. The voltage level Vn11 is sufficiently spaced apart from Vcc/2, and, for this reason, the output inverting circuit 25*f* never changes the voltage level of the output data signal Dout. In other words, the electrically programmable read only memory device implementing the first embodiment never fall into an error in read-out operation.

Second Embodiment

Figure 10:
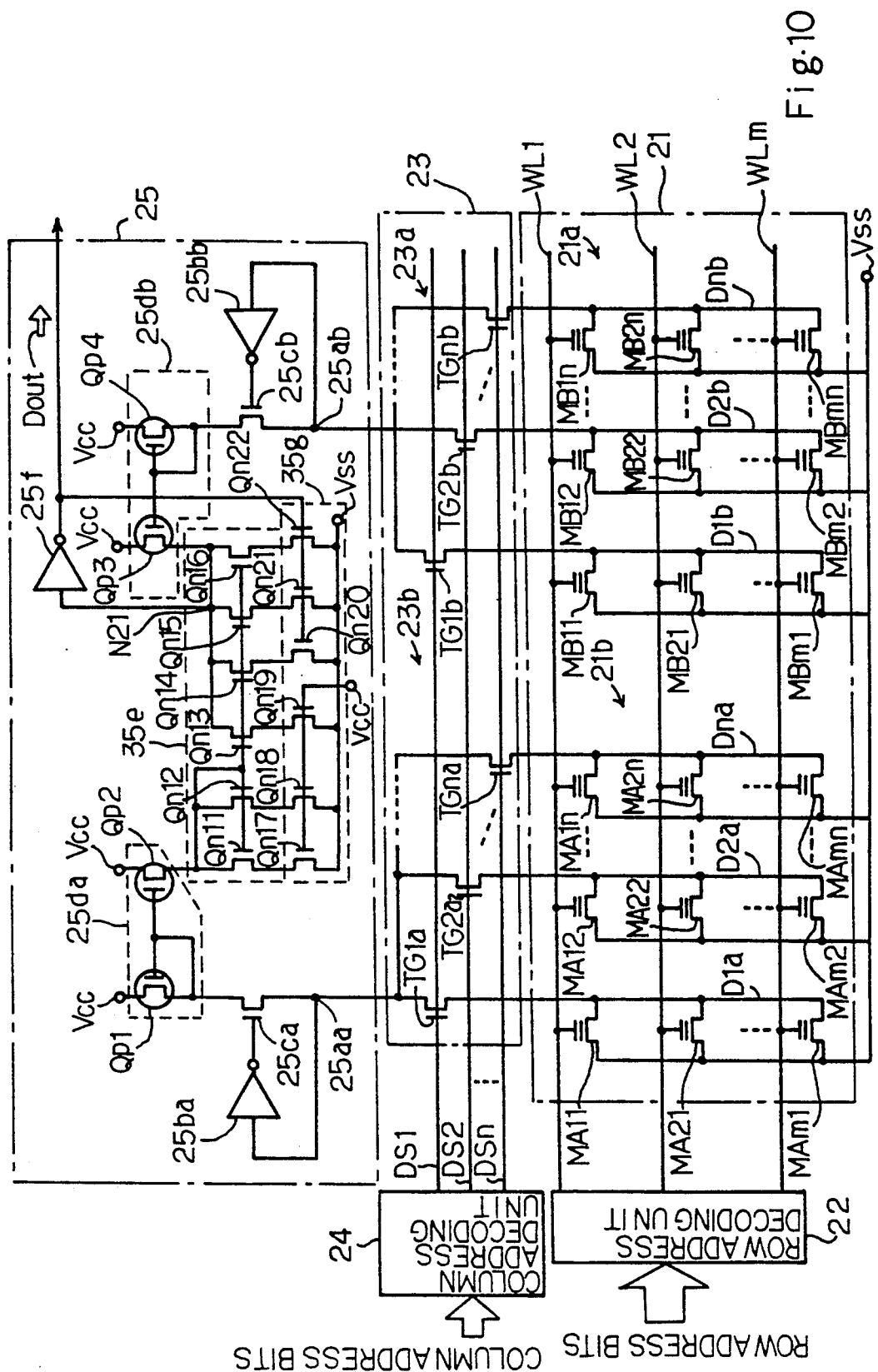
FIG. 10 is a circuit diagram showing the arrangement of another electrically programmable read only memory device according to the present invention.

Turning to FIG. 10 of the drawings, another electrically programmable read only memory device embodying the present invention is illustrated. The electrically programmable read only memory device embodying the second embodiment is similar in circuit arrangement to the first embodiment except for a third current mirror circuit 35*e* and a ratio controlling circuit 35*g*, and component circuits and transistors of the second embodiment are labeled with the same references designating the corresponding circuits and transistors of the first embodiment without any detailed description.

The third current mirror circuit 35*e* is implemented by six n-channel enhancement type field effect transistors Qn11 to Qn16, and the gate electrodes of the n-channel enhancement type field effect transistors Qn11 to Qn16 are coupled with the gate electrode of the n-channel enhancement type field effect transistor Qn11. The n-channel enhancement type field effect transistors Qn11 and Qn12 provide a first current path, and a second current path is formed by the n-channel enhancement type field effect transistors Qn14 to Qn16. The first current is converted to voltage level at the drain node of the n-channel enhancement type field effect transistor Qn11, and the voltage level at the drain node are distributed to the component transistors Qn11 to Qn16. In other words, the first current concurrently controls the conductances of the first and second current paths. The ratio controlling circuit 35*g* is implemented by six n-channel enhancement type field effect transistors Qn17 to Qn22 coupled between the n-channel enhancement type field effect transistors Qn17 to Qn22 and the source voltage line Vss. The gate electrodes of the n-channel enhancement type field effect transistors Qn17 to Qn19 providing the first current path are coupled with the source of power voltage level Vcc, and the n-channel enhancement type field effect transistors Qn20 to Qn22 are concurrently gated by the output data signal Dout. In the following description, the p-channel enhancement type field effect transistors Qp1 to Qp4 are assumed to be equal in transconductance, the n-channel enhancement type field effect transistors Qn11 to Qn16 are assumed to be equal in transconductance, and the n-channel enhancement type field effect transistors Qn17 to Qn22 are assumed to be equal in transconductance for the sake of easy description.

In operation, the data bit is firstly read out from the memory cell implemented by the floating gate type field effect transistor MA11 in the erased state and the floating gate type field effect transistor MB11 in the write-in state, and the column address decoding unit 24 elevates the decoded signal line DS2 instead of the decoded signal line DS1 without changing the word line WL1. The floating gate type field effect transistors MA12 and MB12 are assumed to be in the erased state and in the write-in state, respectively, and first and second current mirror circuits 25da and 2db allows the digit lines D2a and D2b to go up at the same speed toward the threshold level of the inverting circuits 25ba and 25bb. However, the output inverting circuit 25f has already produced the output data signal Dout of the power voltage level Vcc, and the n-channel enhancement type field effect transistors Qn20 to Qn22 have been turned on. Therefore, the drain node N21 remains low, and the output inverting circuit 25f does not change the output data signal Dout.

Figure 11:
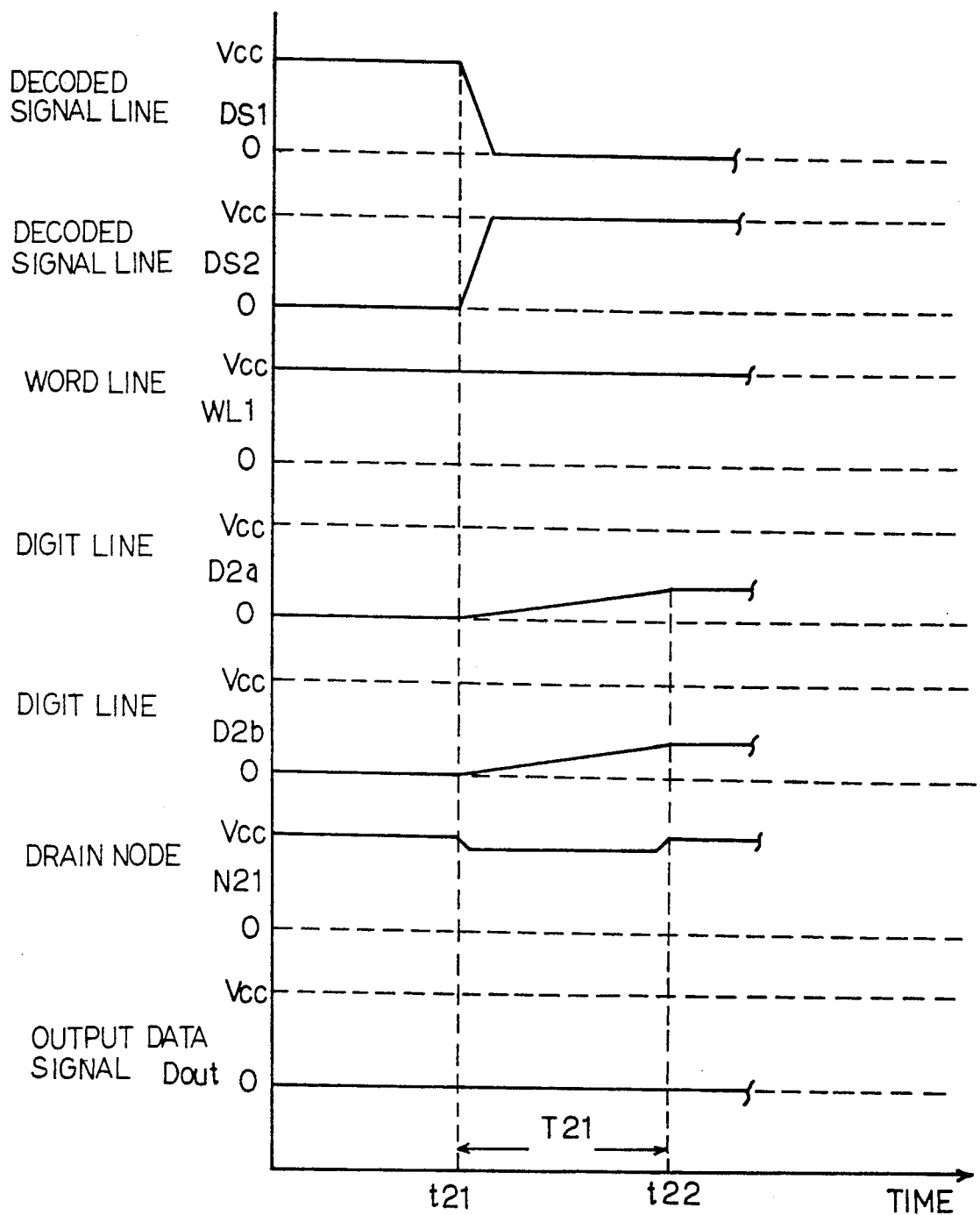
FIG. 11 is a diagram showing the waveforms on component lines and the input node of the electrically programmable read only memory device shown in FIG. 10.
Figure 12:
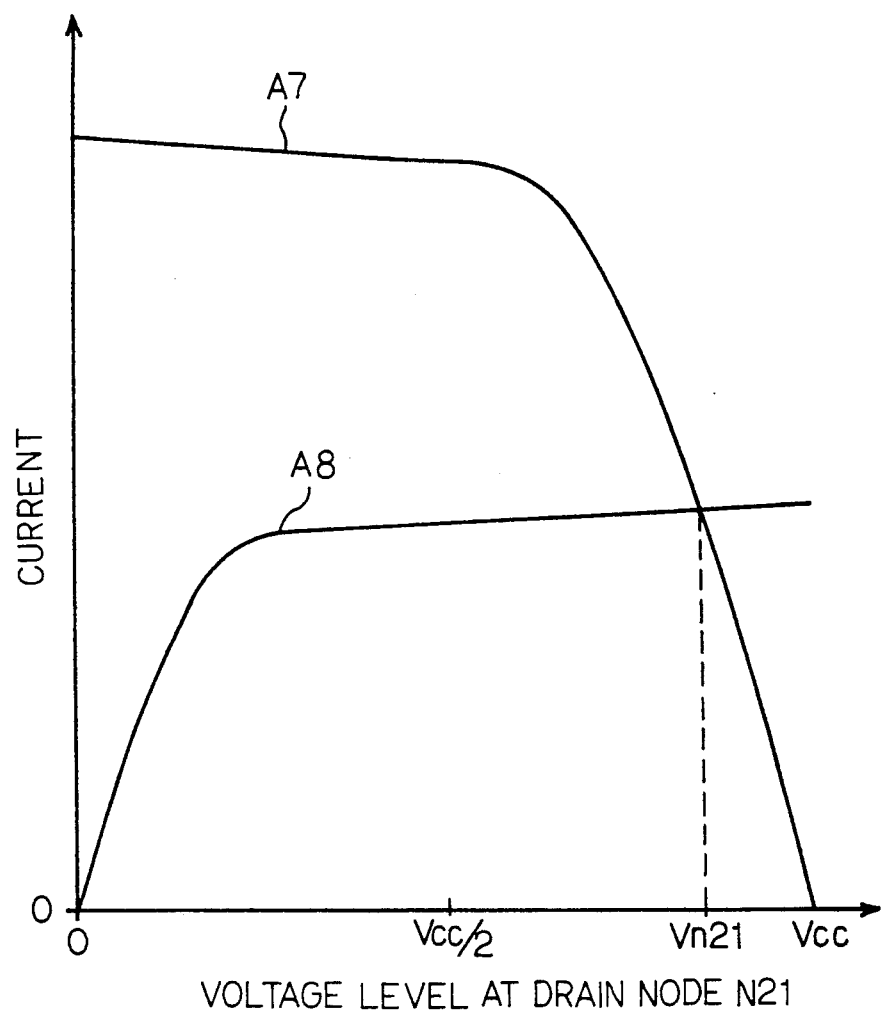
FIG. 12 is a graph showing the voltage level at an input node of an output inverting circuit in terms of currents passing through second and third current mirror circuits incorporated in the electrically programmable read only memory device shown in FIG. 10.

Even if the floating gate type field effect transistors MA11 and MA12 are in the write-in state and the floating gate type field effect transistors MB11 and MB12 are in the erased state, the output data signal Dout is unchanged. Namely, assuming now that the column address decoding unit 24 elevates the decoded signal line DS2 instead of the decoded signal line DS1 at time t21 without changing the word line WL1, the first and second current mirror circuits 25da and 25db charge up the digit lines D2a and D2b at the same speed over time period T21 between times t21 and t22 as shown in FIG. 11. However, the output inverting circuit 25f has already produced the output data signal Dout of the ground voltage level, and the n-channel enhancement type field effect transistors Qn20 to Qn22 have been turned off. Since the p-channel enhancement type field effect transistor Qp3 changes the current driving capability along plots A7 much larger than the current driving capability A8 of the second current path formed by the n-channel enhancement type field effect transistor Qn14 only as shown in FIG. 12, the drain node N21 is regulated to Vn21 widely spaced apart from Vcc/2, and the output inverting circuit 25f never changes the voltage level of the output data signal Dout.

Thus, the ratio controlling circuit 35g of the second embodiment prevents the output inverting circuit 25f from any transient phenomenon regardless of the previous voltage level.

As will be appreciated from the foregoing description, the non-volatile semiconductor memory device according to the present invention never falls into an error in read-out operation by virtue of the ratio controlling circuit, and a reliable read-out data bit is supplied to an external device at extremely high speed.

Although particular embodiments of the present invention have been shown and described, it will be obvious to those skilled in the art that various changes and modifications may be made without departing from the spirit and scope of the present invention. For example, the present invention is applicable to an electrically erasable and programmable read only memory device, and the electrically erasable and programmable read only memory device may evacuate electrons accumulated in the floating gate electrode with Fowler-Nordheim tunneling current. Moreover, the memory cell array may be implemented by another kind of non-volatile semiconductor memory cells except for the floating gate type field effect transistors.

What is claimed is:

1. A non-volatile semiconductor memory device fabricated on a single semiconductor chip, comprising:
   a) a memory cell array having a plurality of non-volatile memory elements arranged in rows and columns, said columns of said non-volatile memory elements being divided into two sections so as to form first and second memory sections, said non-volatile memory elements of said first memory section being respectively paired with said non-volatile memory elements of said second memory section so as to form a plurality of memory cells for storing data bits, respectively;
   b) a plurality of word lines respectively coupled with said rows of said non-volatile memory elements, and selectively activating said memory cells;
   c) first digit lines respectively coupled with the columns of said non-volatile memory elements of said first memory section;
   d) second digit lines respectively coupled with the columns of said non-volatile memory elements of said second memory section, and respectively paired with said first digit lines so as to form digit line pairs for propagating data bits read out from activating memory cells, each of said data bits read out from said activated memory cells being in the form of a difference in voltage level;
   e) a column selecting unit having first and second output nodes, and coupled with said digit line pairs for interconnecting one of said digit line pairs and said first and second output nodes thereof; and
   f) a sensing amplifier unit comprising f-1) a first current mirror circuit coupled between a source of power voltage level and a first input node of said first current mirror circuit for allowing a first current to pass therebetween, and operative to control the amount of said first current, f-2) a first gate means responsive to the voltage level at said first output node, and relaying the voltage level at said first output node to said first input node, f-3) a second current mirror circuit coupled between said source of power voltage level and a second input node of said second current mirror circuit for allowing a second current to pass therethrough, and operative to control the amount of said second current, f-4) a second gate means responsive to the voltage level at said second output node, and relaying the voltage level at said second output node to said second input node, f-5) a third current mirror circuit having a first current path assigned to said first current, a second current path assigned to said second current, a third input node supplied with said first current for concurrently controlling the conductances of said first and second current paths, and a fourth input node supplied with said second current path, f-6) an output inverting circuit having an input node coupled with said fourth input node and producing an output data signal, and f-7) a ratio controlling circuit responsive to said output data signal and operative to change a ratio of the conductance of said second current path to said conductance of said first current path.

2. A non-volatile semiconductor memory device fabricated on a single semiconductor chip as set forth in claim 1, in which said each of said first and second gate means comprises an inverting circuit having an input node coupled to one of said first and second output nodes, and a gate transistor coupled between one of said first and second output nodes and one of said first and second input nodes and gated by said inverting circuit.

3. A non-volatile semiconductor memory device fabricated on a single semiconductor chip as set forth in claim 2, in which each of said first and second current mirror circuits comprises a first transistor with a first channel conductivity type coupled between a first source of voltage level and one of said first and second input nodes, and a second transistor with said second channel conductivity type coupled between said first source of voltage level and one of said third and fourth input nodes, said first and second transistors being gated by said one of said first and second input nodes.

4. A non-volatile semiconductor memory device fabricated on a single semiconductor chip as set forth in claim 3, in which said first current path is established in a third transistor of a second channel conductivity type opposite to said first channel conductivity type, said third transistor being gated by said third input node.

5. A non-volatile semiconductor memory device fabricated on a single semiconductor chip, comprising:
  a) a memory cell array having a plurality of non-volatile memory elements arranged in rows and columns, said columns of said non-volatile memory elements being divided into two sections so as to form first and second memory sections, said non-volatile memory elements of said first memory section being respectively paired with said non-volatile memory elements of said second memory section so as to form a plurality of memory cells for storing data bits, respectively;
  b) a plurality of word lines respectively coupled with said rows of said non-volatile memory elements, and selectively activating said memory cells;
  c) first digit lines respectively coupled with the columns of said non-volatile memory elements of said first memory section;
  d) second digit lines respectively coupled with the columns of said non-volatile memory elements of said second memory section, and respectively paired with said first digit lines so as to form digit line pairs for propagating data bits read out from activated memory cells, each of said data bits read out from said activated memory cells being in the form of a difference in voltage levels;
  e) a column selecting unit having first and second output nodes, and coupled with said digit line pairs for interconnecting one of said digit line pairs and said first and second output nodes thereof; and
  f) a sense amplifier unit comprising f-1) a first current mirror circuit coupled between a source of power voltage level and a first input node of said first current mirror circuit for allowing a first current to pass therebetween, and operative to control the amount of said first current, f-2) a first gate means responsive to the voltage level at said first output node, and relaying the voltage level at said first output node to said first input node, f-3) a second current mirror circuit coupled between said source of power voltage level and a second input node of said second current mirror circuit for allowing a second current to pass therethrough, and operative to control the amount of said second current, each of said first and second current mirror circuits comprising a first transistor with a first channel conductivity type coupled between a first source of voltage level and one of said first and second input nodes, and a second transistor with said second channel conductivity type coupled between said first source of voltage level and one of said third and fourth input nodes, said first and second transistors being gated from said one of said first and second input nodes f-4) a second gate means responsive to the voltage level at said second output node, and relaying the voltage level at said second output node to said second input node, each of said first and second gate means comprising an inverting circuit having an input node coupled to one of said first and second output nodes, and a gate transistor coupled between one of said first and second output nodes and one of said first and second input nodes and gated from said inverting circuit, f-5) a third current mirror circuit having a first current path assigned to said first current, a second current path assigned to said second current, a third input node supplied with said first current for concurrently controlling the conductances of said first and second current paths, and a fourth input node supplied with said second current path, said first current path being established in a third transistor of a second channel conductivity type opposite to said first channel conductivity type, said third transistor being gated from said third input node, said second current path being formed by at least fourth and fifth transistors with said second channel conductivity type and coupled in parallel between said fourth input node and said ratio controlling circuit, said at least fourth and fifth transistors being gated from said third input node, f-6) an output inverting circuit having an input node coupled with said fourth input node and producing an output data signal, and f-7) a ratio controlling circuit responsive to said output data signal and operative to change a ratio of the conductance of said second current path to said conductance of said first current path.

6. A non-volatile semiconductor memory device fabricated on a single semiconductor chip, comprising:
  a) a memory cell array having a plurality of non-volatile memory elements arranged in rows and columns, said columns of said non-volatile memory elements being divided into two sections so as to form first and second memory sections, said non-volatile memory elements of said first memory section being respectively paired with said non-volatile memory elements of said second memory section so as to form a plurality of memory cells for storing data bits, respectively;

b) a plurality of word lines respectively coupled with said rows of said non-volatile memory elements, and selectively activating said memory cells;

c) first digit lines respectively coupled with the columns of said non-volatile memory elements of said first memory section;

d) second digit lines respectively coupled with the columns of said non-volatile memory elements of said second memory section, and respectively paired with said first digit lines so as to form digit line pairs for propagating data bits read out from activated memory cells, each of said data bits read out from said activated memory cells being in the form of a difference in voltage levels;

e) a column selecting unit having first and second output nodes, and coupled wit said digit line pairs for interconnecting one of said digit line pairs and said first and second output nodes thereof; and f) a sensing amplifier unit comprising f-1) a first current mirror circuit coupled between a source of power voltage level and a first input node of said first current mirror circuit for allowing a first current to pass therebetween, and operative to control the amount of said first current, f-2) a first gate means responsive to the voltage level at said first output node, and relaying the voltage level at said first output node to said first input node, f-3) a second current mirror circuit coupled between said source of power voltage level and a second input node of said second current mirror circuit for allowing a second current to pass therethrough, and operative to control the amount of said second current, each of said first and second current mirror circuits comprising a first transistor with a first channel conductivity type coupled between a first source of voltage level and one of said first and second input nodes, and a second transistor with said second channel conductivity type coupled between said first source of voltage level and one of said third and fourth input nodes, said first and second transistors being gated from said one of said first and second input nodes f-4) a second gate means responsive to the voltage level at said second output node, and relaying the voltage level at said second output node to said second input node, each of said first and second gate means comprising an inverting circuit having an input node coupled to one of said first and second output nodes, and a gate transistor coupled between one of said first and second output nodes and one of said first and second input nodes and gated from said inverting circuit f-5) a third current mirror circuit having a first current path assigned to said first current, a second current path assigned to said second current, a third input node supplied with said first current for concurrently controlling the conductances of said first and second current paths, and a fourth input node supplied with said second current path, said first current path being formed by at least ninth and tenth transistors with a second channel conductivity type opposite to said first channel conductivity type coupled in parallel between said third input node and said ratio controlling circuit, said ninth and tenth transistors being gated from said third input node, f-6) an output inverting circuit having an input node coupled with said fourth input node and producing an output data signal, and f-7) a ratio controlling circuit responsive to said output data signal and operative to change a ratio of the conductance of said second current path to said conductance of said first current path.

7. A non-volatile semiconductor memory device fabricated on a single semiconductor chip as set forth in claim 5, in which said ratio controlling circuit comprises at least sixth, seventh and eighth transistors with said second channel conductivity type coupled between said third to fifth transistors and a second source of voltage level, said sixth and seventh transistors having respective gate electrodes coupled with said first source of voltage level, said eighth transistor being gated with said output data signal.

8. A non-volatile semiconductor memory device fabricated on a single semiconductor chip as set forth in claim 6, in which said second current path is formed by at least eleventh, twelfth, thirteenth and fourteenth transistors with said second channel conductivity type coupled in parallel between said fourth input node and said ratio controlling circuit, said eleventh to fourteenth transistors being gated by said third input node.

9. A non-volatile semiconductor memory device fabricated on a single semiconductor chip as set forth in claim 8, in which said ratio controlling circuit comprises at least fifteenth, sixteenth, seventeenth, eighteenth, nineteenth and twentieth transistors with said second channel conductivity type coupled in parallel between said fourth input node and a second source of voltage level, said fifteenth, sixteenth and seventeenth transistors having respective gate electrodes coupled with said first source of voltage level, said eighteenth, nineteenth and twentieth transistors being gated with said output data signal.

* * * * *